United States Patent
Ong

(10) Patent No.: US 7,593,271 B2
(45) Date of Patent: Sep. 22, 2009

(54) MEMORY DEVICE INCLUDING MULTIPLEXED INPUTS

(75) Inventor: Adrian E. Ong, Pleasanton, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 11/744,815

(22) Filed: May 4, 2007

(65) Prior Publication Data

US 2007/0263458 A1 Nov. 15, 2007

Related U.S. Application Data

(60) Provisional application No. 60/798,113, filed on May 4, 2006.

(51) Int. Cl.
  *G11C 7/10* (2006.01)
(52) U.S. Cl. ............... 365/189.03; 365/189.02; 365/230.02
(58) Field of Classification Search ............ 365/189.02, 365/189.03, 230.02, 230.08
  See application file for complete search history.

(56) References Cited

U.S. PATENT DOCUMENTS

| | | | | |
|---|---|---|---|---|
| 5,249,160 A * | 9/1993 | Wu et al. ............... | 365/230.08 |
| 5,490,113 A * | 2/1996 | Tatosian et al. ........ | 365/189.05 |
| 5,590,078 A * | 12/1996 | Chatter .................. | 365/189.03 |
| 5,594,694 A | 1/1997 | Roohparvar et al. | |
| 5,600,606 A * | 2/1997 | Rao ....................... | 365/233.1 |
| 5,734,849 A * | 3/1998 | Butcher ................. | 710/305 |
| 5,829,016 A * | 10/1998 | Sharma et al. .......... | 711/111 |
| 5,898,623 A * | 4/1999 | Clinton et al. .......... | 365/189.04 |
| 6,031,767 A * | 2/2000 | Schuh et al. ............ | 365/189.05 |
| 6,191,603 B1 | 2/2001 | Muradali et al. | |
| 6,215,704 B1 * | 4/2001 | Shimizu ................. | 365/189.02 |
| 6,272,053 B1 * | 8/2001 | Choi ....................... | 365/189.03 |
| 6,425,046 B1 * | 7/2002 | Leung et al. ............ | 711/101 |
| 6,519,171 B2 | 2/2003 | Matsuzaki et al. | |
| 6,732,304 B1 | 5/2004 | Ong | |
| 6,812,726 B1 | 11/2004 | Ong | |
| 6,825,683 B1 | 11/2004 | Berndt et al. | |
| 6,859,399 B1 * | 2/2005 | Azimi et al. ............ | 365/189.03 |
| 6,882,171 B2 | 4/2005 | Ong | |
| 6,954,822 B2 * | 10/2005 | Bains et al. ............. | 711/5 |
| 6,967,397 B2 | 11/2005 | Inoue et al. | |

(Continued)

OTHER PUBLICATIONS

Jedec Solid State Technology Association, "Jedec Standard, Double Data Rate (DDR) SDRAM Specification," May 2005, pp. 1-85, Revision of JESD79D, Jedec Solid State Technology Association, Arlington, Virginia, USA.

(Continued)

*Primary Examiner*—Huan Hoang
(74) *Attorney, Agent, or Firm*—Park, Vaughan & Fleming LLP

(57) ABSTRACT

Systems and methods are described for reducing the number of exterior contacts on a semiconductor package without reducing the number of address, data and control signals used by an integrated circuit interior to the semiconductor package. In some embodiments, two signals may be received at a shared conductor accessible by devices exterior to the semiconductor package and communicated to two contacts on the integrated circuit that are inaccessible to the exterior of the semiconductor package. In various embodiments, signals required to support a full set of features of the JEDEC JESD79E standard or the JEDEC JESD79-2C standard are communicated using a reduced number of exterior contacts.

20 Claims, 12 Drawing Sheets

U.S. PATENT DOCUMENTS

| | | | |
|---|---|---|---|
| 6,996,745 B1 | 2/2006 | Shaylor | |
| 7,006,940 B1 | 2/2006 | Ong | |
| 7,057,964 B2 * | 6/2006 | Hong et al. | 365/230.08 |
| 7,061,263 B1 | 6/2006 | Ong | |
| 7,079,445 B2 * | 7/2006 | Choi et al. | 365/189.02 |
| 7,133,798 B1 | 11/2006 | Ong | |
| 7,139,945 B2 | 11/2006 | Ong | |
| 7,184,322 B2 * | 2/2007 | Takahashi et al. | 365/189.02 |
| 7,240,254 B2 | 7/2007 | Ong | |
| 7,245,141 B2 | 7/2007 | Ong | |
| 7,254,582 B2 | 8/2007 | Song et al. | |
| 7,265,570 B2 | 9/2007 | Ong | |
| 7,269,524 B1 | 9/2007 | Ong et al. | |
| 7,269,765 B1 | 9/2007 | Charlton et al. | |
| 7,305,595 B2 | 12/2007 | Goodwin et al. | |
| 7,307,442 B2 * | 12/2007 | Ong | 324/765 |
| 7,309,999 B2 * | 12/2007 | Ong | 324/765 |
| 7,310,000 B2 * | 12/2007 | Ong | 324/765 |
| 7,313,740 B2 * | 12/2007 | Ong | 714/718 |
| 7,336,554 B2 * | 2/2008 | Kim et al. | 365/219 |
| 7,365,557 B1 * | 4/2008 | Ong | 324/765 |
| 7,370,256 B2 * | 5/2008 | Ong | 714/731 |
| 7,404,117 B2 * | 7/2008 | Ong et al. | 714/718 |
| 2002/0105522 A1 * | 8/2002 | Kolluru et al. | 345/519 |
| 2004/0019841 A1 * | 1/2004 | Ong | 714/738 |
| 2005/0204223 A1 | 9/2005 | Ong | |
| 2005/0289428 A1 * | 12/2005 | Ong | 714/742 |
| 2007/0013402 A1 * | 1/2007 | Ong et al. | 324/765 |
| 2007/0067687 A1 * | 3/2007 | Ong | 714/731 |
| 2007/0079204 A1 * | 4/2007 | Ong | 714/738 |
| 2007/0113126 A1 * | 5/2007 | Ong | 714/724 |

OTHER PUBLICATIONS

Jedec Solid State Technology Association, "Jedec Standard, DDR2 SDRAM Specification," May 2006, pp. 1-110, JESD79-2C, Jedec Solid State Technology Association, Arlington, Virginia, USA.

* cited by examiner

MEMORY DEVICE INCLUDING MULTIPLEXED INPUTS

CROSS-REFERENCE TO RELATED APPLICATIONS

This application claims benefit of U.S. Provisional Patent Application Ser. No. 60/798,113 filed on May 4, 2006, entitled "Integrated Circuit Testing Module including Multiplexed Inputs." The disclosure of the above application is hereby incorporated herein by reference.

BACKGROUND OF THE INVENTION

1. Field of the Invention

The present invention relates generally to semiconductor devices, and more particularly to packaging semiconductor devices.

2. Description of Related Art

Integrated circuits, for example memory, are used in a wide variety of applications. Typically, memory conforms to accepted standards. For example, many memory standards are defined by the Joint Electron Device Engineering Council, also known as the JEDEC Solid State Technology Association (JEDEC). Designs for memory that conform to standards such as JEDEC standards are well known. Moreover, memory layouts and lithographic masks for standard memories are readily available. It is desirable to use such standard memory designs in an application rather than redesigning the memory specifically for a different application. However, the number of external contacts used for standard memory is determined by the standard for the memory design. The minimal size of the package sometimes is limited by the number and pitch of the contacts. This is a disadvantage of the prior art.

FIG. 1 illustrates a prior art standard (JESD79C) timing diagram for a memory bank write operation. In this standard, a first set of inputs A0-An, A10, BA0 and BA1 are used to input an address and a second set of inputs DQ and DM are used to write data values starting at the address. The data values are written several clock cycles after the address as input.

FIG. 2 illustrates a timing diagram for a memory bank read operation according to the prior art standard of FIG. 1. In this operation, inputs A0-An, A10, BA0 and BA1 are used to input an address and DQ and DQS are used to output data stored starting at that address. The data values are read several clock cycles after the address as output.

FIG. 3 illustrates a prior art bond pad layout for a memory device proposed by JEDEC. The illustration includes 79 bottom pads and 44 top pads. A variety of data (DQ, DQS and DM), address (A, BA) pads are illustrated. This particular configuration includes 32 DQ pads and, thus, can handle 32-bit data.

SUMMARY OF THE INVENTION

Various embodiments of the invention include a package having a memory, internal memory contacts on an integrated circuit substrate, and external contacts for communicating signals between the memory contacts and external devices. The internal memory contacts optionally conform to an industry standard such as the JEDEC JESD79E standard or the JEDEC JESD79-2C standard. One or more of the external contacts are shared contacts configured to communicate signals to different members of the memory contacts at different times and/or in different modes. The package may include fewer external contacts than internal memory contacts. By reducing the number of external contacts, smaller package sizes may be achieved.

The package further includes interface circuits disposed between the memory contacts and the shared external contacts. In various embodiments, the interface circuits include latches, multiplexers, PROMs, buffers, and/or the like. In some embodiments, one of the interface circuits is configured to communicate an address signal from an address memory contact to a shared external contact in an address mode, and communicate a data signal between a data memory contact and the shared external contact in a data mode. Alternatively, the interface circuit is configured to communicate an address signal and a control signal, or a data signal and a control signal, between the shared external contact and a respective address memory contact, data memory contact, or control memory contact.

Various embodiments of the invention include a memory device comprising a plurality of memory cells configured to store data, a first memory contact configured to communicate data signals to or from the plurality of memory cells, a second memory contact configured to communicate address signals or command signals to the plurality of memory cells, a shared external contact configured to communicate the data signals in a first mode, and to receive the address signals or the command signals in a second mode, an interface configured to communicate the data signals between the shared external contact and the first memory contact in the first mode, and to communicate the address signals or the command signals from the shared external contact to the second memory contact in the second mode, a control input configured to change a mode of the memory device between the first mode and the second mode, and a semiconductor package including the plurality of memory cells, at least part of the shared electrical conductor, and the interface.

Various embodiments of the invention include a system comprising a semiconductor package, a plurality of memory cells incorporated in the semiconductor package and configured to store data, the memory cells coupled to a first memory contact and a second memory contact, a shared contact at least partially external to the semiconductor package and configured to receive a first signal in a first mode and a second signal in a second mode, a first circuit incorporated in the semiconductor package and configured to communicate the first signal between the shared contact and the first conductor in the first mode, a second circuit incorporated in the semiconductor package and configured to communicate the second signal between the shared contact and the second conductor in the second mode, and a control input to the semiconductor package and configured for changing between the first mode and the second mode.

Various embodiments of the invention include a memory device comprising a plurality of memory cells configured to store data and coupled to a first memory contact and a second memory contact, a shared contact configured to receive a first signal during a first time period and a second signal during a second time period, a circuit configured to communicate the first signal between the shared contact and the first memory contact during the first time period and communicate the second signal between the device contact and the second memory contact during the second time period, and a semiconductor device package including the plurality of memory cells, at least part of the shared contact, and the circuit.

Various embodiments of the invention include a system comprising a semiconductor package containing a memory configured to store data, a first memory contact electronically coupled to the memory, a second memory contact electronically coupled to the memory, a first shared contact external to the memory, the first shared contact configured to communicate with a device external to the semiconductor package, and configured to receive a first signal in a first mode and a second signal in a second mode, and at least one multiplexer circuit configured to convey the first signal from the first terminal to the first memory contact when the memory is in the first mode, and to convey the second signal from the first terminal to the second memory contact when the memory is in the second mode.

DETAILED DESCRIPTION

Multiplexing is used to communicate signals between a memory circuit and external contacts. The memory circuit and external contacts may be associated within a SIP (system-in-package), PoP (package-on-package), or the like. In some embodiments the memory circuit includes the testing interface described in U.S. patent application Ser. No. 11/304,445 entitled "Integrated Circuit Testing Module" and filed Dec. 14, 2005, or the testing interface described in U.S. Pat. No. 6,882,171 issued Apr. 19, 2005 both of which are hereby incorporated herein by reference. In various embodiments, the multiplexed signals communicated between the external contacts and the memory circuits include data, addresses, and/or commands. In various embodiments, the multiplexed signals are configured for accessing memory circuits. For example, in some embodiments, addresses and data are communicated through a shared external contact. In various embodiments, addresses and commands, or data and commands are communicated through a shared external contact.

Figure 4:
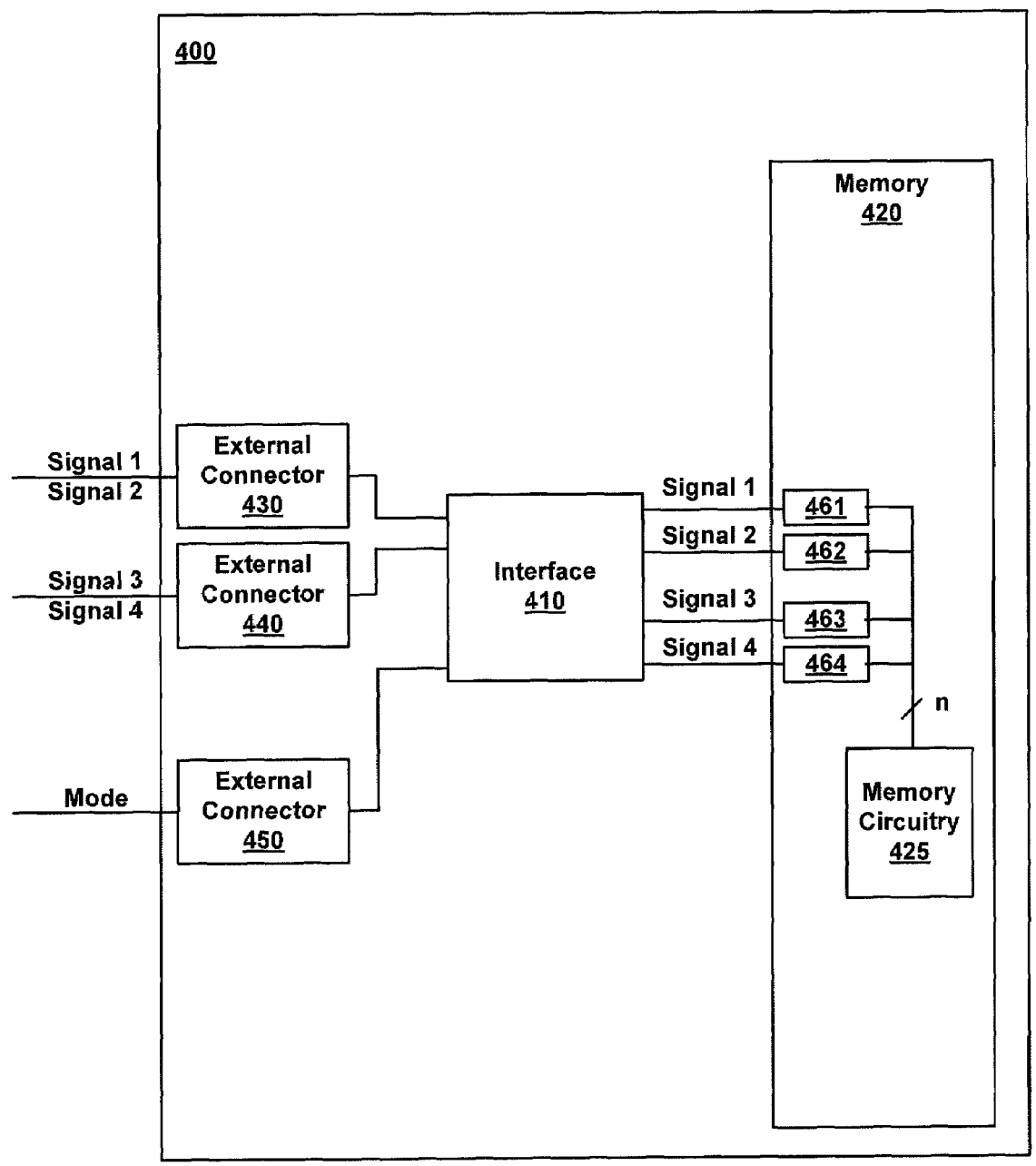
FIG. 4 illustrates a semiconductor package including a memory and an interface in accordance with various embodiments of the invention.

FIG. 4 illustrates a semiconductor package 400 in accordance with various embodiments of the invention. The semiconductor package 400 includes a memory 420, an interface 410 and external contacts, 430, 440 and 450. Although the semiconductor package 400 as illustrated includes an interface 410, a memory 420, and external contacts 430, 440, and 450, the semiconductor package 400 may include fewer or more components and still fall within the scope of various embodiments.

The memory 420 includes memory contacts 461-464 and memory circuitry 425 internal to the memory 420. The memory circuitry includes an array of memory cells and memory interface logic configured to receive signals according to standard communications protocol and provide access to the array of memory cells.

The memory contacts 461-464 are typically physically inaccessible to external devices and are part of the same wafer as the memory circuitry 425. The memory contacts 461-464 are electronically coupled to the memory circuitry 425 via a plurality (e.g., "n") of conductors. The memory contacts 461-464 are configured to communicate signals 1-4 respectively between the interface 410 and the memory circuitry 425 of the memory 420. The memory contacts 461-464 may include a pad, contact, trace, conductor, bond, test point, solder pad, bond pad, contact pad, and/or the like. Although the memory 420 is illustrated as having memory circuitry 425 and memory contacts 461-464, fewer or more memory contacts and/or more memory circuits may be included in the memory 420 and still fall within the scope of various embodiments.

The external contacts 430, 440 and 450 are accessible from outside the semiconductor package 400 and are configured for making electrical contact with one or more external devices (not shown). The external contacts 430, 440 and 450 are not typically part of the wafer on which the memory circuitry 425 is fabricated. The external contacts 430, 440 and 450 may include a connector, pin, post, balls, socket, support balls, wire wrap pin, test point, solder pad, contact pad, and/or the like.

The external contact 430 is configured to communicate a signal 1 and a signal 2 between an external device and the interface 410. The external contact 440 is configured to communicate a signal 3 and a signal 4 between an external device and the interface 410.

External contact 450 is configured to receive a mode signal and couple the mode signal to the interface 410. The mode signal is configured to place the interface 410 alternatively in a first or a second state. In some embodiments, the interface 410 is responsive to the logic state of the mode signal. For example, the interface 410 is placed in the first state when the mode signal is a logical 1 and in the second state when the mode signal is a logical 0. Alternatively, the interface 410 is in the first state unless a logical 1 is asserted by the mode signal. In some embodiments, the interface 410 is responsive to a change of state the mode signal. For example, the interface 410 may default to the first state until receiving a pulse from the mode signal. Then the interface 410 may be placed in the second state for a predetermined period of time and return the first state. The predetermined period of time may be detected using analog circuitry or digital logic (e.g., a clock, a clock and a counter, a clock and a shift register, and/or the like). Alternatively, the interface may change state between the first state and the second state when receiving a pulse from the mode signal. In some embodiments, a serial bit pattern (e.g., 01010) may place the interface 410 in the first state and another logical pattern (e.g., 01100) may place the interface 410 in the second state. Serial bit patterns may be defined that place the interface 410 in additional states (e.g., 3, 4, 8, 16, or more states).

In some embodiments, external contact 450 is optional. In these embodiments, the interface 410 is by default in a first mode and after receipt of signals in the first mode automatically switches to a second mode. After signals are received in the second mode or after a number of clock cycles, the interface 410 automatically switches back to the first mode. For example, the interface 410 may be by default in an address mode. After address data and a READ or WRITE command are received by the semiconductor package 400, the interface 410 automatically switches to a data mode in which data is communicated through the same shared external contacts as the address data was received. These modes are discussed further elsewhere herein. While the examples discussed herein refer to a mode signal received through the external contact 450, it should be understood that in these examples this mode signal may be generated automatically using circuits within interface 410, and that external contact 450 is optional.

The interface 410 may be a part of the same wafer as the memory circuitry 425. Alternatively, the external contacts 430, 440, and/or 450 may be a part of the interface 410. In some embodiments, the interface 410 includes one or more discrete devices separate from the memory 420 and the external contacts 430, 440, and/or 450. Examples of the interface 410 include multiplexers, buffers, ASICS, and/or the like.

The interface 410 receives the mode signal from the external contact 450. When the mode signal places the interface 410 in the first state, the interface 410 is configured to couple signal 1 between the external contact 430 and the memory contact 461 and couple signal 3 between the external contact 440 and the memory contact 463. When the mode signal places the interface 410 in the second state, the interface 410 is configured to couple signals 2 and 4 between the external contacts 430 and 440 and the memory contacts 462 and 464 respectively. Thus, one external contact 430 can be shared between the memory contacts 461 and 462. Likewise, one external contact 440 can be shared between the two memory contacts 463 and 464. Thus, the four signals 1-4 can be communicated between memory contacts 461-464 and an external device via two external contacts 430 and 440. In some embodiments, it is assumed that the signal received at external contact 430 is signal 1 unless a received command or other signal (e.g. an internally generated signal or a signal received via external contact 450) indicates otherwise.

In various embodiments, signals 1 and 3 include address signals and signals 3 and 4 include data signals. For example, when mode signal places the interface 410 in the first state, the address signals 1 and 3 are input from the external contacts 430 and 440 via the interface 410 to the memory contacts 461 and 463 respectively. When the mode signal places the interface 410 in the second state during a read operation, the data signals 2 and 4 are output from the memory contacts 462 and 464 via the interface 410 to the external contacts 430 and 440 respectively. Alternatively, during a write operation when the mode signal is in the second state, the data signals 2 and 4 are input to the memory contacts 462 and 464 via the interface 410 from the external contacts 430 and 440 respectively.

In some embodiments, signals 1 and 3 include address signals and signals 2 and 4 included control signals. Alternatively, signals 1 and 3 include data signals and signals 2 and 4 include control signals. In some embodiments, it is assumed that the signal received at external contact 430 is an address signal unless a received command (e.g., a mode signal) or other signal indicates otherwise. While the interface 410 is illustrated as being configured to coupling two shared external contacts to two pair of memory contacts, the interface 410 may be configured to couple more or fewer shared external contacts to pairs of memory contacts and still fall within the scope of various embodiments. For example, the interface 410 may be configured to couple at least 1, 3, 4, 8, 16 or 32 shared external contacts to pairs of memory contacts.

Figure 1:
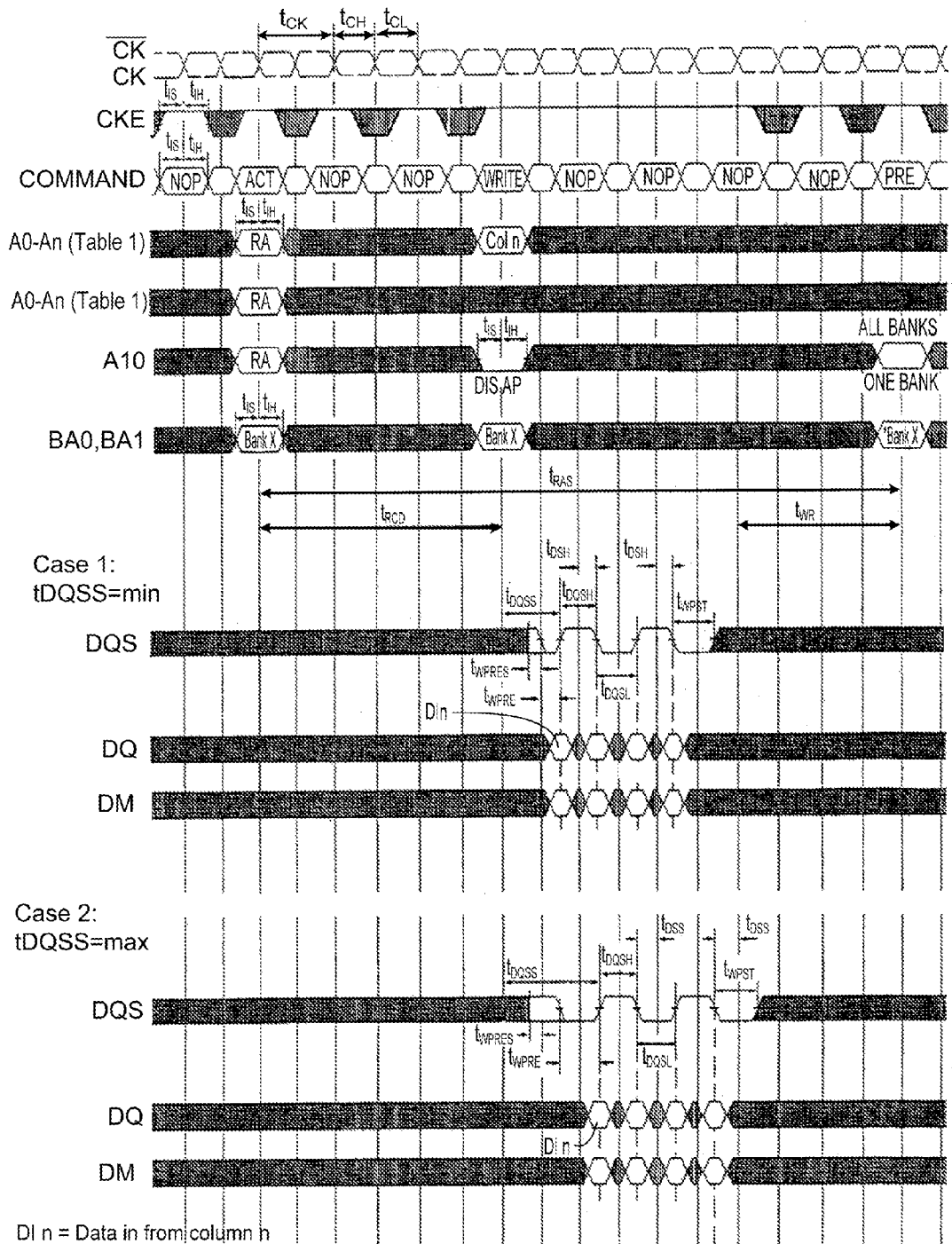
FIG. 1 illustrates a prior art standard (JESD79C) timing diagram for a memory bank write operation.
Figure 2:
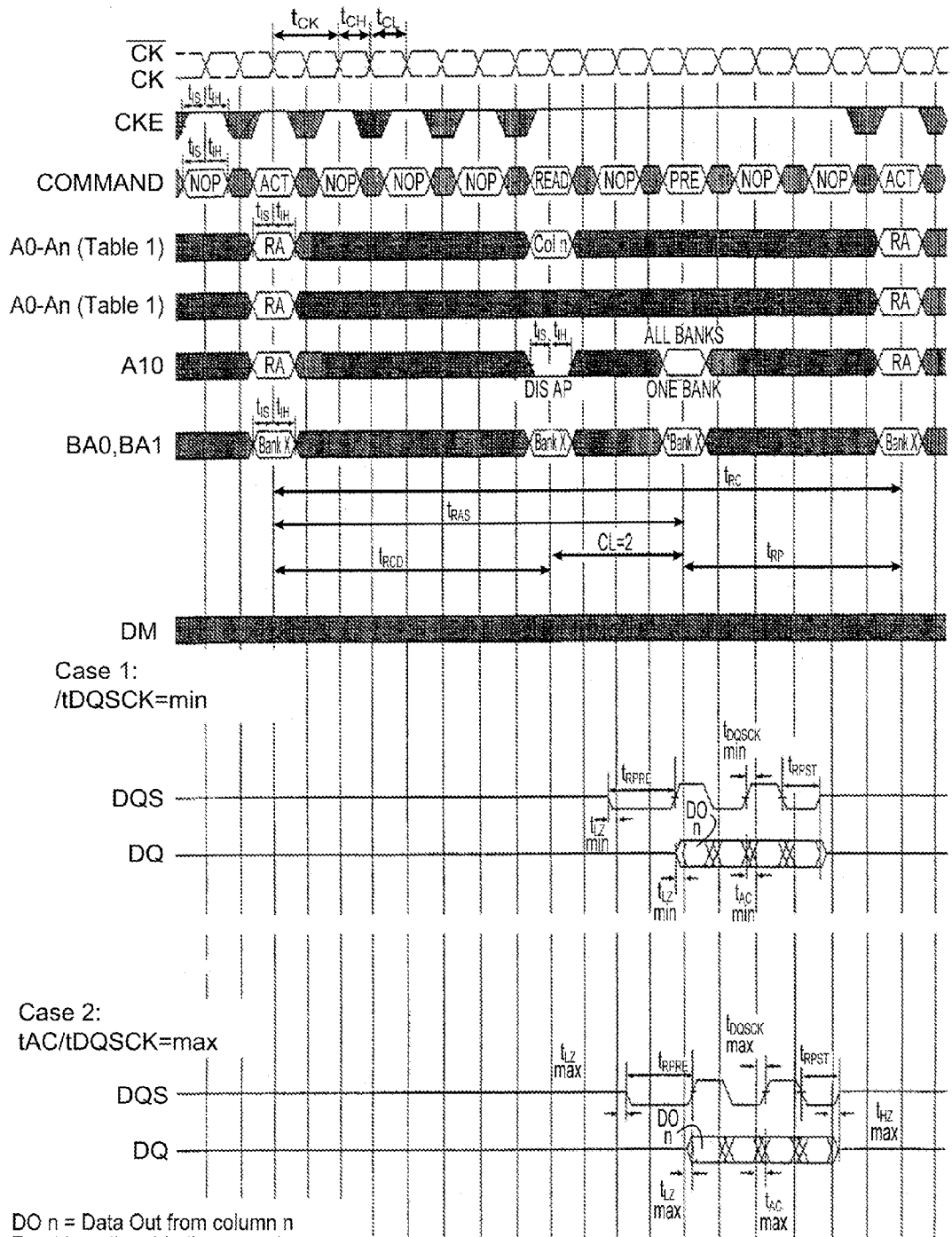
FIG. 2 illustrates a timing diagram for a memory bank read operation according to the prior art standard of FIG. 1.
Figure 3:
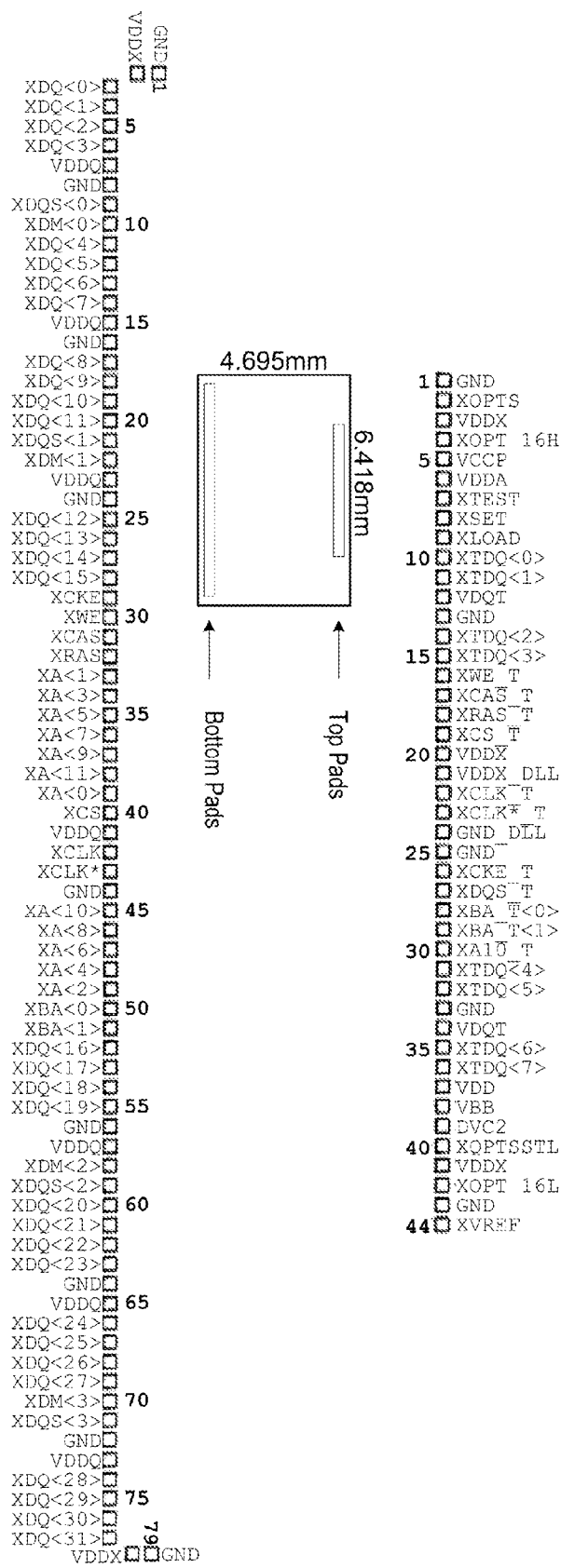
FIG. 3 illustrates a prior art bond pad layout for a memory device proposed by JEDEC.
Figure 5:
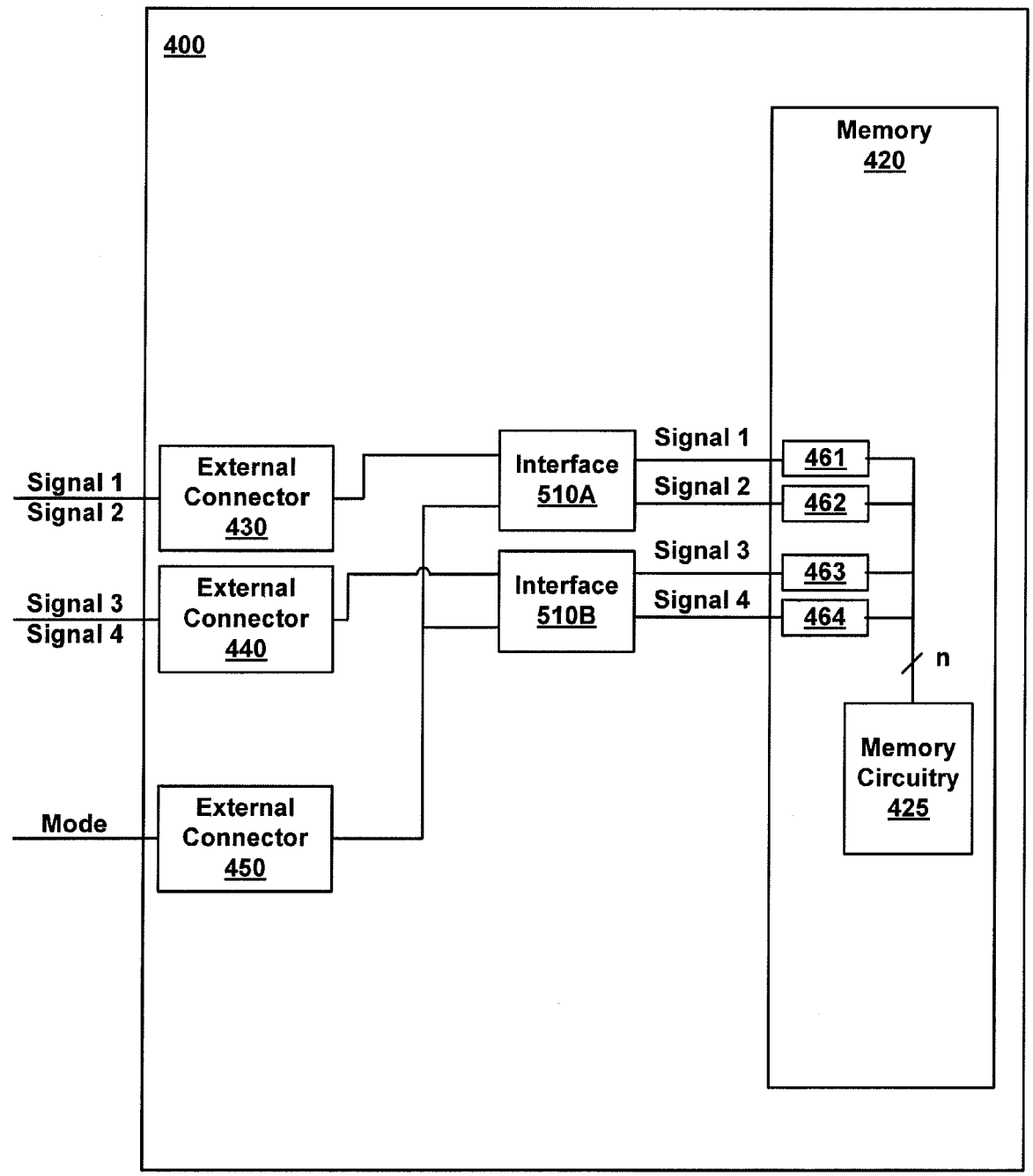
FIG. 5 illustrates the semiconductor package of FIG. 4 including an alternative embodiment of the interface of FIG. 4.

FIG. 5 illustrates the semiconductor package 400 including an alternative embodiment of the interface 410 of FIG. 1. FIG. 5 differs from FIG. 4 in that the interface 410 is shown as two interfaces namely, interface 510A and 510B. External contact 450 is configured to couple the mode signal to both the interface 510A and interface 510B. The mode signal is configured to place the interface 510A and interface 510B alternatively in a first or a second state. As discussed elsewhere herein, the interface 510A and/or 510B may be responsive to the logical state of the mode signal, the change in the mode signal, a serial bit pattern of the mode signal, and/or the like.

The interface 510A is configured to couple the shared external contact 430 to the memory contact 461 while in the first state and couple the shared external contact 430 to the memory contact 462 while in the second state. Likewise, the interface 510B is configured to couple the shared external contact 440 to the memory contact 463 in a first state and to the memory contact 464 in a second state. Thus, the external contact 430 may be shared between the memory contacts 461 and 462 through the interface 510A and the external contact 440 may be shared between the memory contacts 463 and 464 through the interface 510B. Examples of the interface 510A and 510B include gates, multiplexers, latches, buffered latches, ASICS, and/or the like.

In some embodiments, the signals received at external contact 450 are buffered, interpreted or otherwise processed before being used to control the interface 510A. In typical embodiments, the external contacts 430 and 440 are part of a plurality of shared external contacts configured for communicating data in parallel to the memory 420 via a plurality of interfaces 510.

Figure 6:
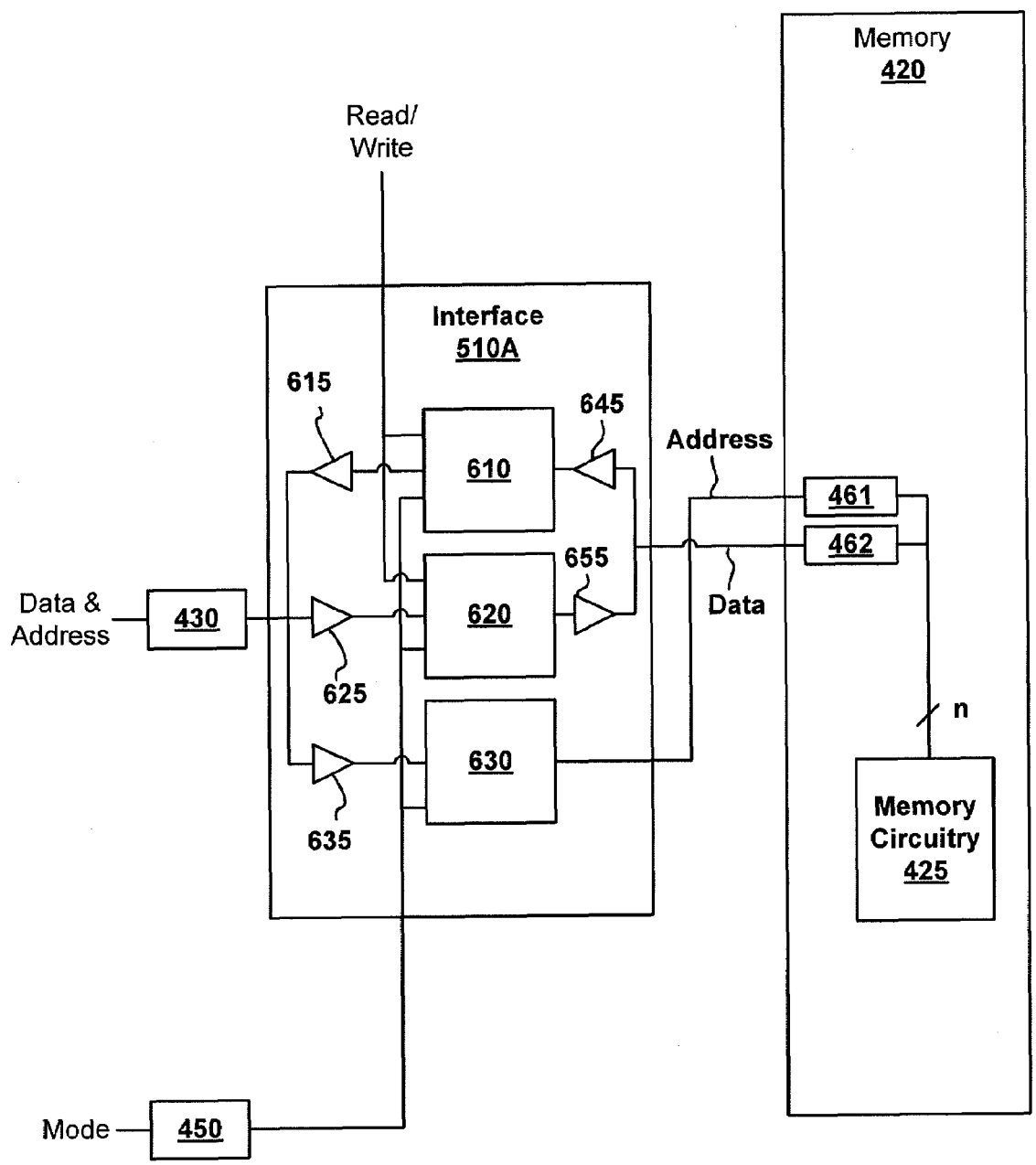
FIG. 6 illustrates details of the interface of FIG. 5 according to various embodiments of the invention.

FIG. 6 illustrates details of the interface 510A according to various embodiments of the invention. These embodiments include the external contacts 430, external contact 450, memory contact 461 and memory contact 462. The external contact 440, memory contact 463, and memory contact 464 illustrated in FIGS. 4 and 5 are omitted for clarity. As illustrated in FIG. 6, the external contact 430 is configured to communicate data signals and address signals between an external device (not shown) and the interface 510A. In some embodiments, the external contact 430 is configured to communicate data signals between a first external device and the memory 420, and to communicate address signals between a second external device and the memory 420.

In some embodiments, the mode signal is configured to place the interface 510A in an address mode or a data mode. In the address mode, address signals are communicated from the external device to the memory 420. In the data mode, data signals are communicated between the external device and the memory 420. As discussed elsewhere herein, data may be read and/or written several clock cycles, after the address is sent to the memory 420. Thus, a mode change from the address mode to the data mode may occur one or more clock cycles after the address signals are communicated.

The interface 510A is configured to receive a read/write signal that places the interface 510A in a read state or a write state for controlling whether the data is read from or written to the memory 420. In the read state, data is communicated via the interface 510A from the memory 420 to the external device. In a write state, the data is communicated via the interface 510A from the external device to the memory 420. In various embodiments, the read/write signal may be received from the memory 420, from another circuit within the semiconductor package 400 or an external device via an external contact (not shown).

The interface 510A includes latches 610, 620 and 630, and buffers 615, 625, 645 and 655. In various embodiments, the buffers 615, 625, 645 and/or 655 may be inverting, non-inverting, tri-state, open collector, and/or the like. The latches 610, 620 and/or 630 may include circuitry (e.g., gates, buffers, counters, multiplexers, and/or the like) for signal manipulation and/or conditioning. The shared external contact 430 is coupled to one or more buffers in the interface 510A, e.g., the buffers 615, 625 and 635. The external contact 450 couples the mode signal to one or more latches 610, 620, and 630.

The mode signal places the interface 510A in the address mode by disabling the latches 610 and 620 and enabling the latch 630. When the interface 510A is in the address mode, the buffer 635 is configured to receive an address signal from the external contact 430 and provide the address signal into the latch 630. The latch 630 is configured to latch the address signal and provide the address signal to the memory contact 461.

After receiving an address signal in the address mode, the mode signal can place the interface 510A in the data mode by disabling the latch 630 and enabling the latches 610 and 620. In the data mode, the interface 510A is configured to either communicate data from the memory 420 to the external device in the read state, or communicate data from the external device to the memory 420 in the write state.

For reading data, the read/write signal is configured to place the interface 510 in a read state by disabling the latch 620 and the leaving latch 610 enabled. While the interface 510A is in the data mode and the read state, the memory contact 462 is configured communicate a data signal from the memory circuitry 425 to the buffer 645 in the interface 510A. The buffer 645 is configured to communicate the data signal to the latch 610, which is configured to latch and provide the data signal to the buffer 615. The external contact 430 is configured to communicate the data signal from the buffer 615 to the external device. During a block read, the interface 510A may remain in the data mode for multiple clock cycles while the memory circuitry 425 provides multiple data signals to the external device through the memory contact 462, buffer 645, latch 610, buffer 615 and external contact 430.

For writing data, the read/write signal is configured to place the interface 510 in the write state by disabling the latch 610 and leaving the latch 620 enabled. While the interface is in the data mode and the write state, the external contact 430 is configured to communicate a data signal from the external device to the buffer 625 in the interface 510A. The buffer 625 is configured to provide the data signal to the latch 620 for output to the buffer 655. The memory contact 462 is configured to communicate the data signal from the buffer 655 to the memory circuitry 425. During a block write, the interface 510A may remain in the data mode for multiple clock cycles while the external device provides multiple data signals to the memory circuitry 425 through the external contact 430, buffer 625, latch 620, buffer 655, and memory contact 462.

Thus, the external contact 430 is configured to communicate both address and bidirectional data. The external contact 430 can communicate address signals while the interface 510A is in the address mode, and can communicate both read data and write data while the interface 510A is in the data mode.

Figure 7:
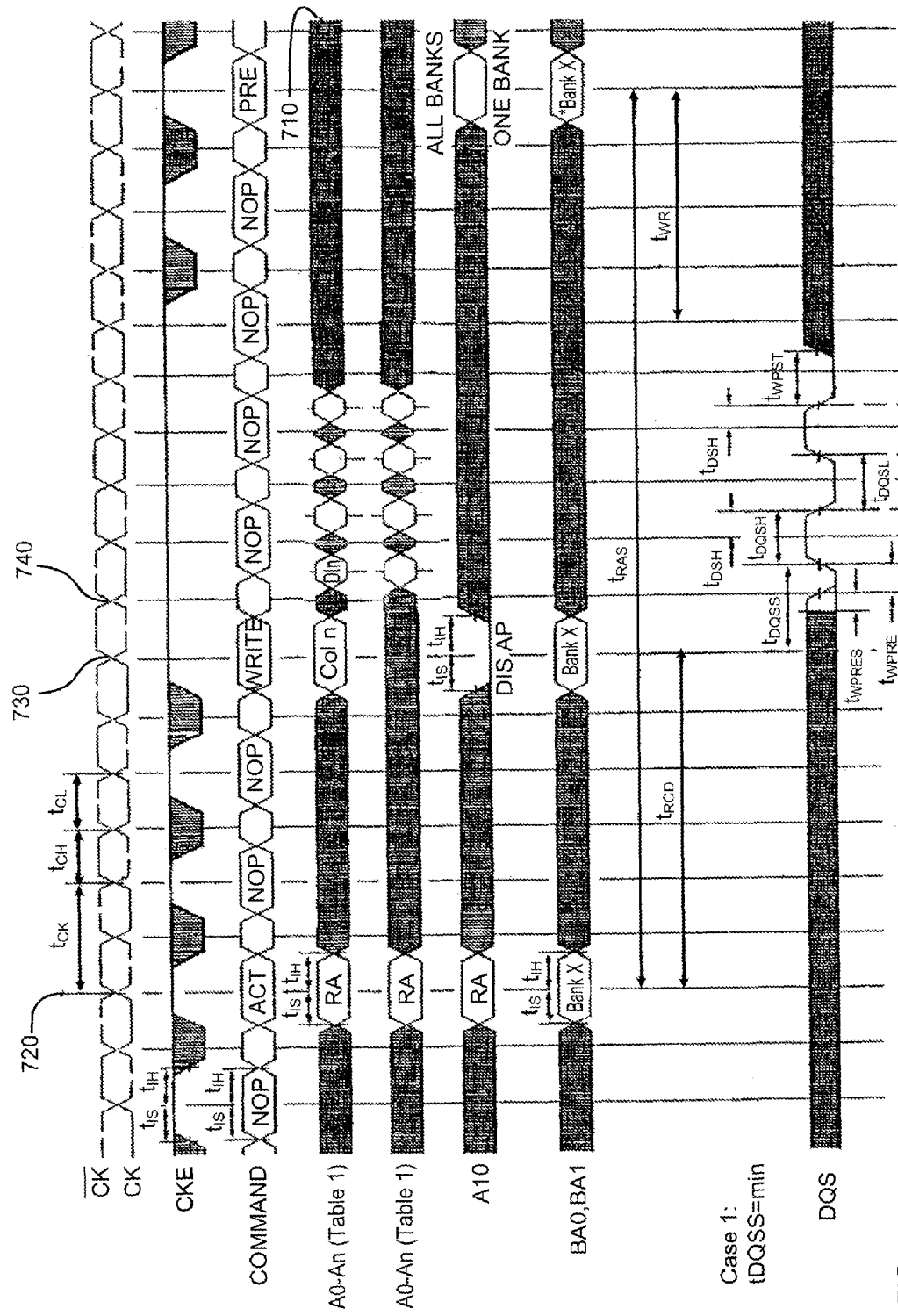
FIG. 7 is a timing diagram illustrating the use of the interface of FIG. 5 for writing data to a memory, according to various embodiments of the invention.

FIG. 7 is a timing diagram illustrating the use of the interface 510A for writing data to the memory 420, according to various embodiments of the invention. The address signals and the data signals in FIG. 7 are both communicated through the external contact 430. The signals at the external contact 430 are illustrated by a Timing Trace 710. At a Third Clock Cycle 720, an ACT command and row address signals are received. At a Tenth Clock Cycle 730 a WRITE command and column address signals are received. The WRITE command is configured to set latches 610, 620 and 630 in a state for receiving data signals rather than address signals. In some embodiments, external contact 450 is one of the external contacts used to receive the WRITE command. In some embodiments, WRITE command is used by circuitry within semiconductor package 400 to generate a mode signal. At approximately an Eleventh Clock Cycle 740, data signals are received at the external contact 430. Interface 510A is optionally automatically returned to the address mode after the data signals are received. The various clock cycles discussed herein represent different time periods.

Typically, two or more (e.g., A0-An) instances of external contacts 430 are configured to receive address signals and data signals in parallel according to the timing diagram of FIG. 7. For example, FIGS. 4 and 5 illustrate two instances of external contacts, namely external contacts 430 and 440. External contacts 430 and 440 are configured to receive address signals and data signals in parallel, where signals 1 and 3 are address signals and signals 2 and 4 are data signals. In some embodiments, there are a greater number of data channels (bits) than address channels and some of the data signals are optionally received at external contacts that are not shared. In some embodiments, there are a greater number of address channels (bits) than data channels and some of the address signals are optionally received at external contacts that are not shared. The parallel address signals and the data signals may be received at (m) instances of shared external contacts (e.g., external contact 430) where (m) is the maximum number of address bits and data bits that can be shared.

Figure 8:
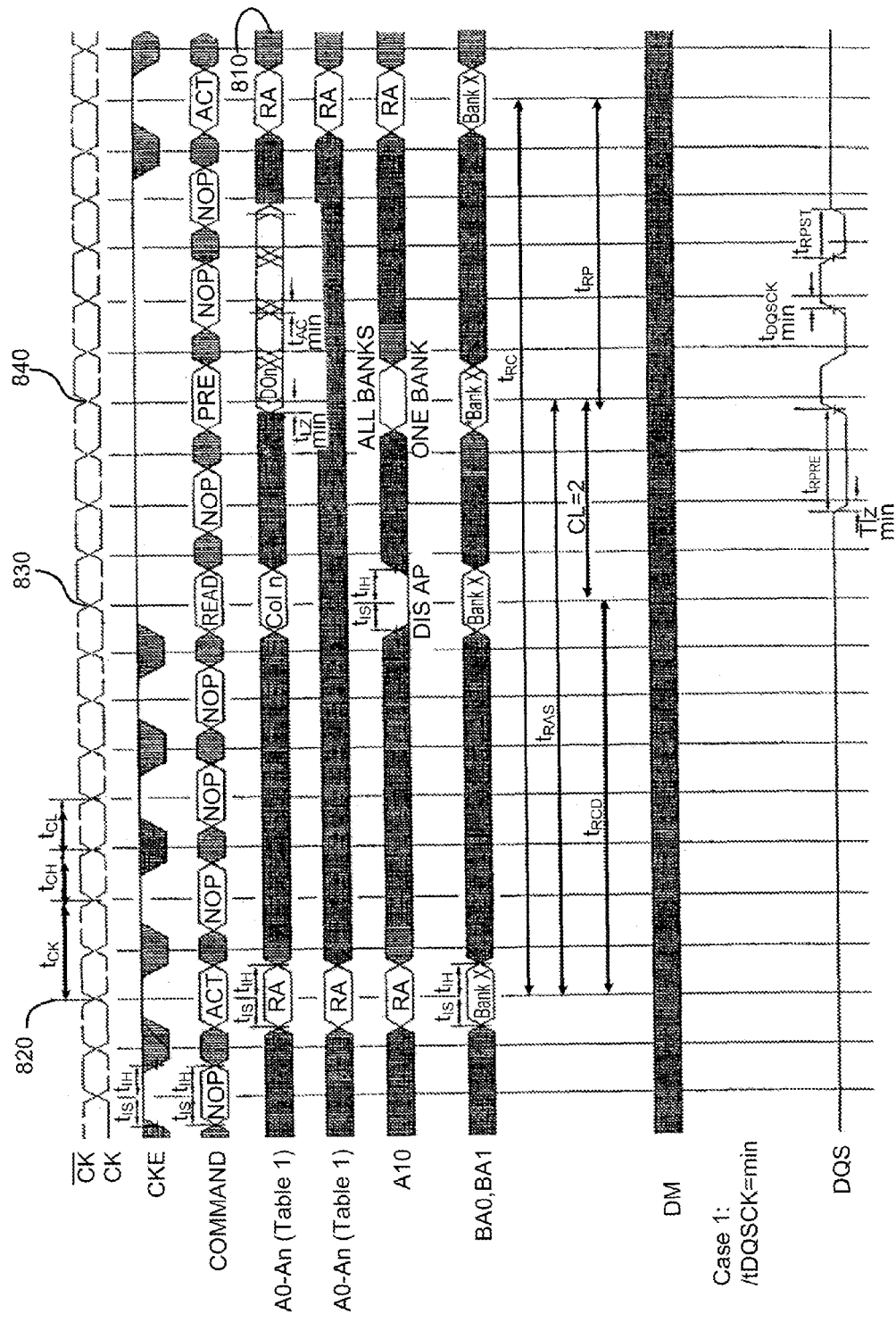
FIG. 8 is a timing diagram illustrating the use of the interface of FIG. 5 for reading data from memory, according to various embodiments of the invention.

FIG. 8 is a timing diagram illustrating the use of the interface 510A for reading data from memory, according to various embodiments of the invention. As illustrated in FIG. 8, an ACT command and a row address is received at the Third Clock Cycle 820. The row address is received at the external contact 430. At the Eleventh Clock Cycle 830 a READ command and a column address is received at the external contact 430. Receipt of the READ command is optionally used to generate a mode signal configured to change the state of the interface 510A to a data state. Starting at approximately a Fifteenth Clock Cycle 840, a PRECHARGE command is received and data is sent out of the external contact 430 to an external device. As in the process illustrated in FIG. 7, each of these communications may include the receipt or transmission of several bits in parallel using multiple shared external contacts (e.g., external contact 430).

While the embodiments illustrated in FIGS. 3-8 include multiplexing of address and data signals, a similar approach may be used to multiplex data and command signals, and/or address and command signals.

In some embodiments, it is possible that further commands may be received while data is being read from memory. In these embodiments, an independent signal may be used to instruct the circuit of FIG. 6 to stop outputting data and prepare to receive commands. This independent signal may be received through a dedicated external contact, through external contact 450, or through another instance of external contact 430. For example, in some embodiments a dedicated external contact is used as an interrupt to allow halting of a data read in order to send further commands. In some embodiments, some instances of external contact 430 are used to communicate command and data signals, while at least one instance of external contact 430 is used to communicate addresses and the above independent signal.

Figure 9:
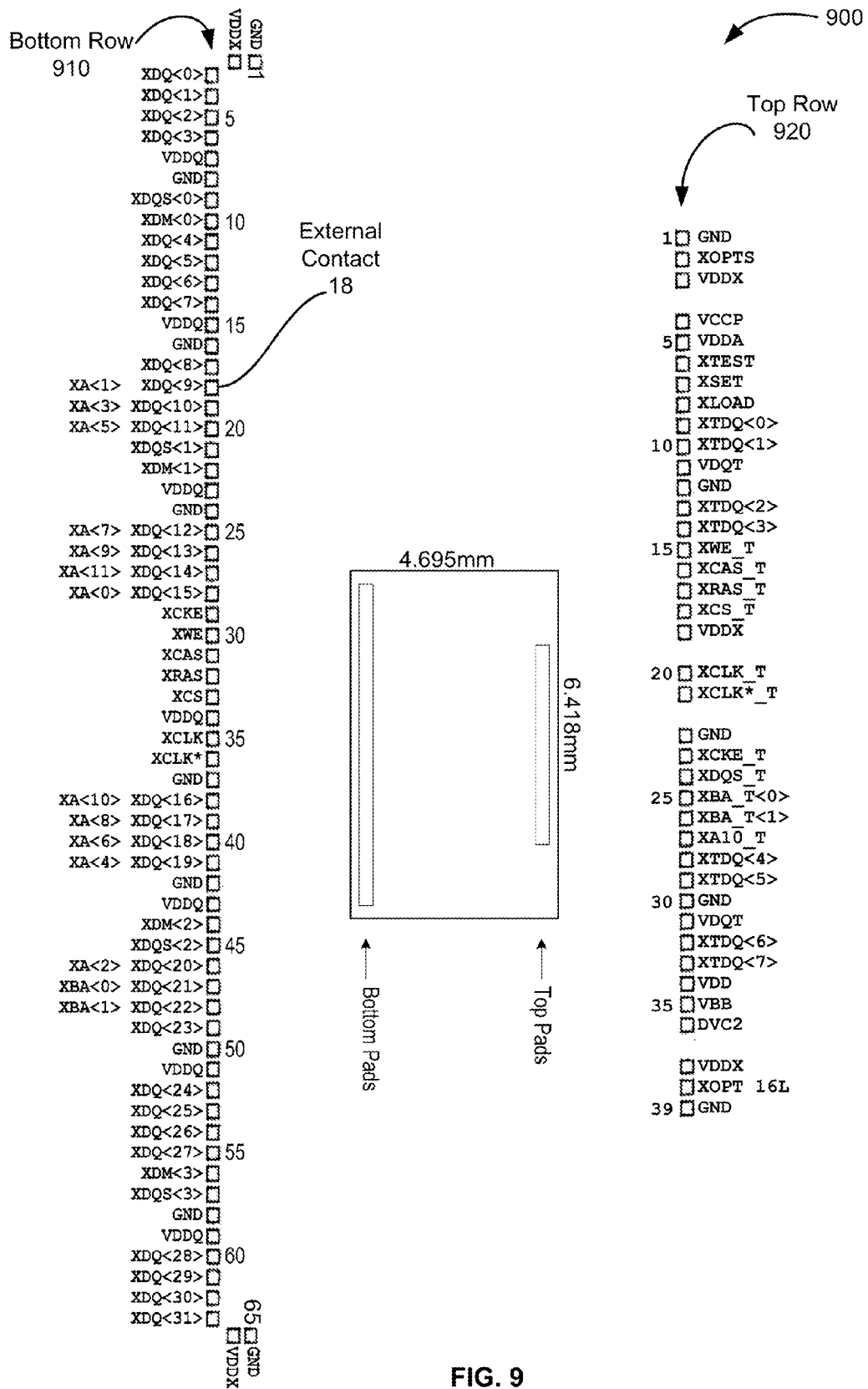
FIG. 9 illustrates an external contact layout for a semiconductor package, according to various embodiments of the invention.

FIG. 9 illustrates an external contact layout 900 for the semiconductor package 400, according to various embodiments of the invention. In this illustration, instances of the external contact 430 are labeled as being configured to communicate two data types. For example, external contact 18 on the bottom row 910 is labeled "XA<1> and XDQ<9> to indicate that it is an emobiment of external contact 430 configured to receive bit <1> of an address (XA), and to send and receive bit <9> of data (XDQ). In the embodiments illustrated, fourteen external contacts are shared. In some embodiments, the use of shared external contacts (e.g., external contact 430) reduces the total number of external contacts and allows for a reduced device size. For example, the elimination of fourteen external contacts with a pitch of 80 microns saves approximately 1.1 mm.

Figure 10:
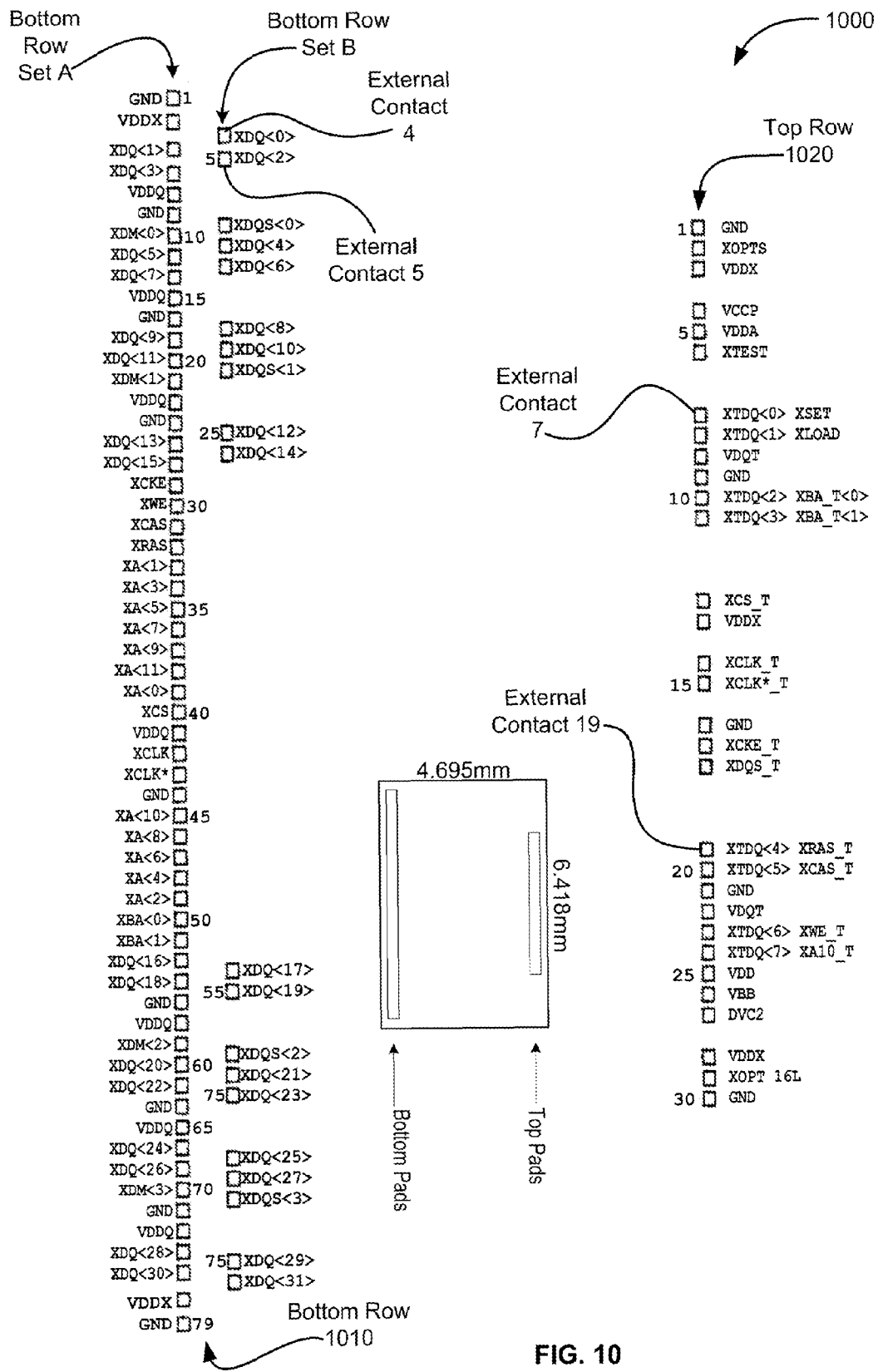
FIG. 10 illustrates an alternative external contact layout for a semiconductor package, according to various embodiments of the invention.

FIG. 10 illustrates an alternative external contact layout 1000 for the semiconductor package 400, according to various embodiments of the invention. In this illustration, several instances of external contact 430 are disposed on the top row 1020, e.g., external contact 7. In addition, the bottom row 1010 is split into two sets, Set A and Set B. For example, external contacts 4 and 5 (XDQ<0> and XDQ<2>) are included in Set B and shifted slightly to the center of the external contact layout 1000. Some of the instances of external contact 430 illustrated in FIG. 10 are configured for alternatively communicating command and address signals. For example, external contact 19 of the top row 1020 is configured for communicating the XRAS_T command signal and the XTDQ<4> data signal. External contact 430 can be configured for communicating test signals in a test mode as well as normal signals in an address or data mode. Some embodiments of external contact layout 900 and 1000 include shared external contacts (e.g., external contact 430) on both the bottom row 910 and 1010, and the top row 920 and 1020.

Figure 11:
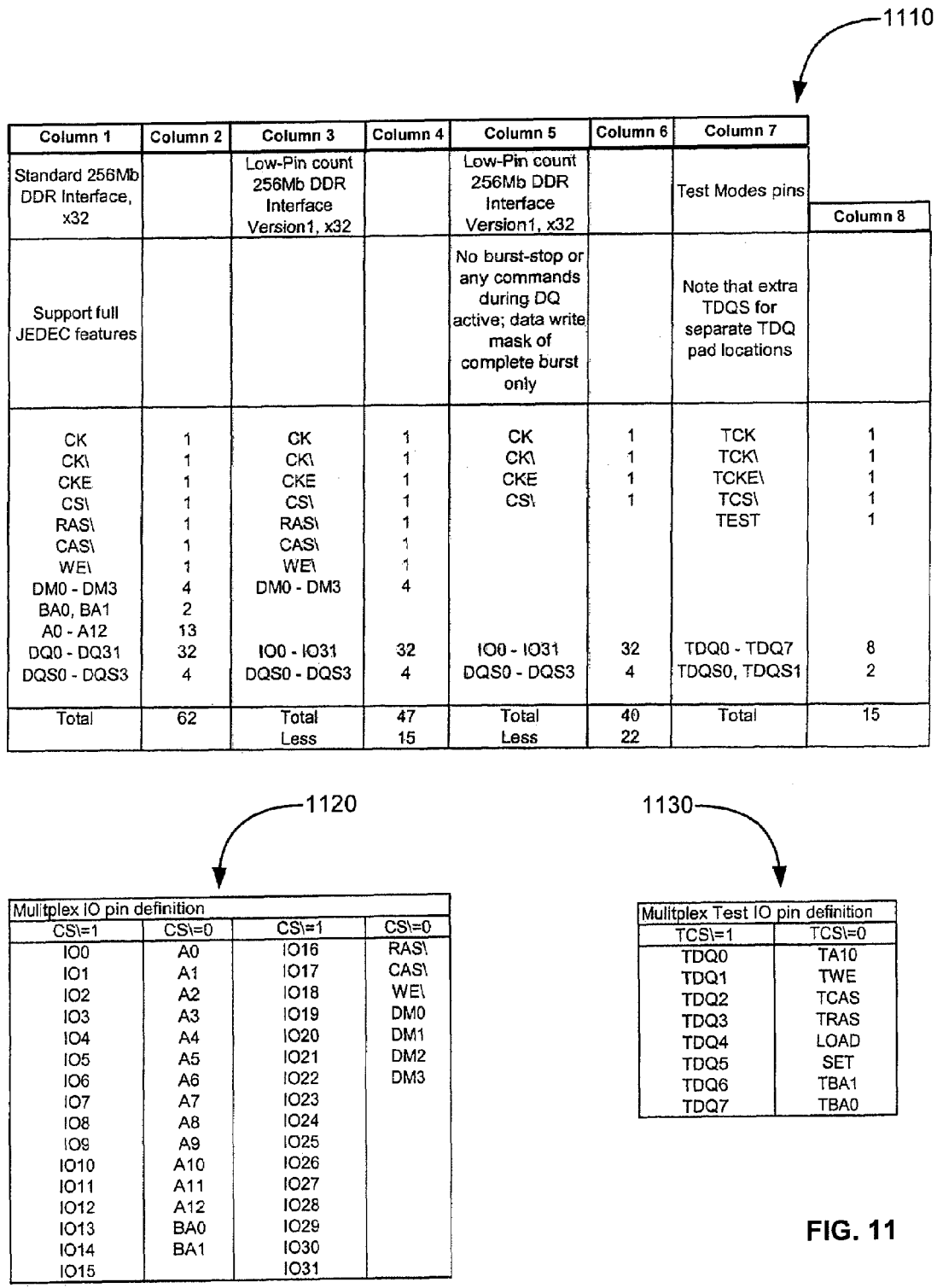
FIG. 11 illustrates an external contact count table, a multiplex I/O pin definition table and a multiplex test I/O pin definition table, according to various embodiments of the invention.

FIG. 11 illustrates an external contact count chart (Table 1110), a multiplex I/O pin definition chart (Table 1120) and a multiplex test I/O pin definition chart (Table 1130), according to various embodiments of the invention. Column 1 of Table 1110 lists the signals required for support of JEDEC features in a standard 256 Mb double data rate (DDR) memory interface. These standards may include, for example, the JESD79E or JESD79-2C standards. Column 2 of Table 1110 lists the number of exterior contacts required to support the signals in Column 1. The bottom of Column 2 indicates that the total number of exterior contacts required is 62.

Column 3 of Table 1110 lists the signals required to support the same set of JEDEC features as supported by the signals in Column 1, using a reduced number of external contacts. Note that 15 address signals of Column 1, namely BA0, BA1, and A0-A12 have been multiplexed with 15 data signals, e.g., DQ0-DQ14. The multiplexed signals, along with the remaining data signals that are not multiplexed are renamed IO0-IO31 in Column 3, indicating that data signals multiplexed with address signals are I/O signals.

Column 4 lists the number of exterior contacts required to support the signals in Column 3. The bottom of Column 4 indicates that the total number of exterior contacts required is 47. Thus, multiplexing the signals BA0, BA1, and A0-A12 with DQ0-DQ14 reduces by 15 the number of exterior contacts required to support the JEDEC features supported by the signals in Column 1.

Column 5 of Table 1110 lists the signals required to support a reduced set of JEDEC features using a reduced number of external contacts. Additional signals (e.g., RAS\, CAS\, WE\, DM0, DM1, DM2, DM3) have been multiplexed with DQ15-21. The signals listed in Column 5 may not support burst stop or any commands while DQ is active, and support data write masking only of a complete burst.

Column 6 of Table 1110 lists the number of external contacts required to support the signals in Column 5. The bottom of Column 6 indicates that the total number of exterior contacts required is 40. Thus, multiplexing the additional signals as illustrated in Column 5 reduces the number of external contacts by 22.

Column 7 of Table 1110 illustrates how test mode data signals and test control signals may be multiplexed. Both the test control signals and test data signals are multiplexed through the same shared external contact. (Addresses are generated internally.) The combined signals are labeled TDQ0-TDQ7. Column 8 illustrates the number of external contacts required to support the signals in Column 7.

Table 1120 illustrates details for multiplexing the data and address signals in Column 1 of Table 1110. A mode signal, namely, active low chip select (CS\) may be provided to the external contact 450 for placing the interface 410 in a data mode (CS\=1) or an address mode (CS\=0). When the mode signal places the interface 410 in the data mode, the I/O signal 100 (multiplexed DQ0) may be communicated on the external contact 430, and the I/O signal 101 (multiplexed DQ1) may be communicated on the external contact 440. Alternatively, when the mode signal places the interface 410 in the address mode the address signal A0 may be communicated on the external contact 430, and address signal A1 may be communicated on the external contact 440. Likewise, the data signals IO2-IO14 and the address signals A2-B1 respectively may be communicated on additional instances of shared external contacts.

Table 1130 illustrates a mode signal, namely, active low test chip select (TCS\) that may be coupled to the external contact 450 for placing the interface 510A in a test data mode (TCS\=1) or a control mode (TCS\=0). When the mode signal places the interface 510A in a test data mode, the test data signal TDQ0 may be communicated on the external contact 430. Alternatively, when the mode signal places the interface 510A in the control mode the control signal TA10 may be communicated on the external contact 430. Likewise, the test data signals TCQ1-TDQ7 and the control signals TWE-TBA0 respectively may be communicated on additional instances of shared external contacts.

Figure 12:
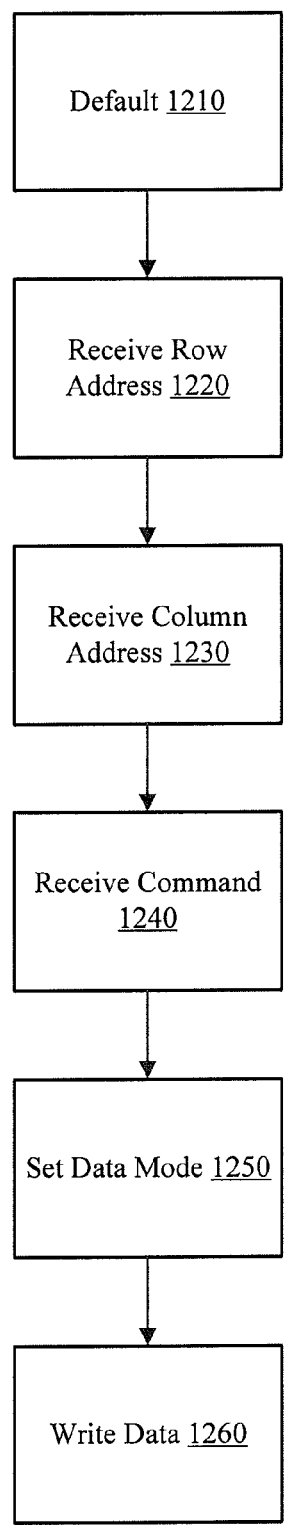
FIG. 12 illustrates methods of writing data to memory according to various embodiments of the invention.

FIG. 12 illustrates methods of writing data to memory according to various embodiments of the invention. These methods make use of the external contact 430 to communicate various signals.

In an optional default step 1210, the interface 510A is placed in a default mode in which the signal expected at one or more shared external contacts, e.g., external contact 430, is a row address. In the default mode, the interface 510 is configured to communicate address signal from the external contact 430 to the memory contact 462. The default mode is optionally the default state of the memory 420. In some embodiments, the mode is set by sending an appropriate mode signal to the external contact 450.

In a receive row address step 1220, a row address and optionally a bank address is received via the one or more shared external contacts, e.g., external contact 430. Receive row address step 1220 may also include receiving an ACT command.

In a receive column address step 1230, a column address is received via the one or more shared external contacts, e.g., external contact 430. In alternative embodiments, the column address is received prior to the row address.

In a receive command step 1240, a WRITE command is received. The WRITE command is optionally received through one or more external contacts. The WRITE command may be received contemporaneously with the column address of receive column address step 1230. The WRITE command signal may be gated, buffered, and/or conditioned and communicated to the interface 510A for placing the interface 510A into a write state.

In a set data mode step 1250, the interface 510A receives a mode signal from the external contact 450 that places the interface 510A into the data mode and configures the interface 510A to communicate data from the external contact 430 to the memory 420. In alternative embodiments, receipt of the WRITE command is used to automatically place the interface 510A in the data mode.

In a write data step 1260, data is written to the memory 420 through the external contact 430 and the interface 510A to the memory 420. The external contact 430 communicates the data from the external device to the buffer 625 in the interface 510A. The latch 630 communicates the data from the buffer 625 to the buffer 655 and the memory contact 461 receives the data from the buffer 655.

Figure 13:
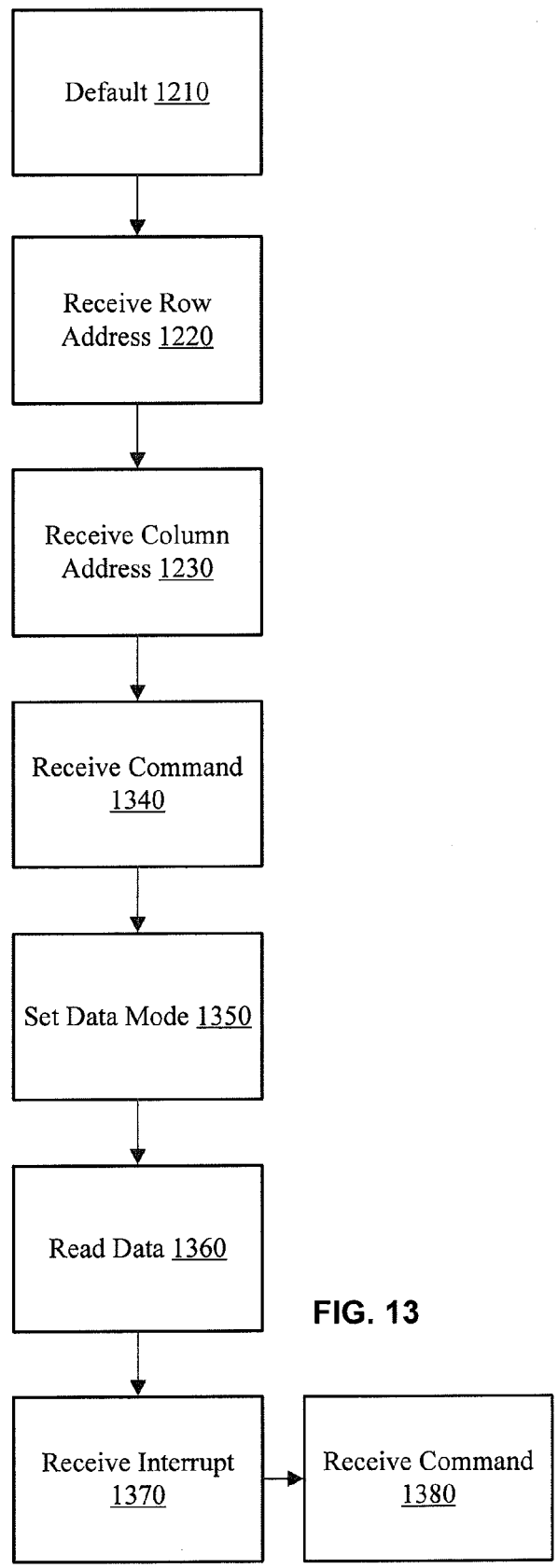
FIG. 13 illustrates methods of reading data from memory according to various embodiments of the invention.

FIG. 13 illustrates methods of reading data from memory according to various embodiments of the invention. In the methods of FIG. 13, optional Default step 1210, receive row address step 1220 and receive column address step 1230 are performed as described with respect to FIG. 12.

In a receive command step 1340, a READ command is received. The READ command is optionally received through one or more external contacts. The READ command may be received contemporaneously with the column address of receive column address step 1230. The READ command signal may be gated, buffered, and/or conditioned and communicated to the interface 510A for placing the interface 510A into a read state.

In a select data mode step 1350, the interface 510A receives a mode signal that places the interface 510A into a data mode and configures the interface 510A to communicate data from the external contact 430 to the memory 420. In alternative embodiments, receipt of the READ command is used to automatically place the interface 510A in the data mode.

In a read data step 1360, data is read from the memory 420 through the memory contact 461 and the interface 510A to the external contact 430. The memory contact 461 communicates the data from the memory 420 to the buffer 645 in the interface 510A. The latch 610 communicates the data from the buffer 645 to the buffer 615 and the external contact 430 communicates the data from the buffer 615 to the external device.

In an optional receive interrupt step 1370, an interrupt signal is received while data is still being read from the memory 420. The interrupt signal is configured to halt the output of data from the memory 420 and to place the memory 420 in a mode to receive a command, using an external contact. The interrupt signal received in the receive interrupt step 1370 is optionally received through a shared external contact, e.g., external contact 430, which may also be used for communicating test signals, address signals, command signals, or the like. For example, if a command external contact is not multiplexed with data or address signals then the interrupt signal may share an external contact with the command external contact. In various embodiments, an interrupt signal is used in relation to READ and/or BURST READ commands.

In an optional receive command step 1380, a command is received using the one or more shared external contacts that were used to read data in read data step 1360, e.g., the external contact 430.

Several embodiments are specifically illustrated and/or described herein. However, it will be appreciated that modifications and variations are covered by the above teachings and within the scope of the appended claims without departing from the spirit and intended scope thereof. For example, while "external contacts" are discussed herein for the purposes of example, semiconductor package 400 may itself be placed in a packaging as part of a system-in-package or package-in-package device. In this case, the external contacts may be coupled to another device, e.g., an ASIC, within the outermost packaging and the external contacts need not be external to the outermost packaging.

The memory devices discussed herein may include other types of RAM in addition to DDR RAM. In some embodiments, e.g., in the case of SDRAM, a latency period may be included between communication of commands and data I/O. Further, while the examples discussed herein are primarily in regard to command, address and data external contacts using in a normal mode, some embodiments include multiplexing of test pins (e.g., /TRAS, and /TCAS may be multiplexed with TDQ). In these embodiments, the TCS external contact or other appropriate external contact is used to control the state of the multiplexed external contacts.

The embodiments discussed herein are illustrative of the present invention. As these embodiments of the present invention are described with reference to illustrations, various modifications or adaptations of the methods and or specific structures described may become apparent to those skilled in the art. All such modifications, adaptations, or variations that rely upon the teachings of the present invention, and through which these teachings have advanced the art, are considered to be within the spirit and scope of the present invention. Hence, these descriptions and drawings should not be considered in a limiting sense, as it is understood that the present invention is in no way limited to only the embodiments illustrated.

What is claimed is:

1. A memory device comprising:
    a plurality of memory cells configured to store data;
    a first memory contact configured to communicate data signals to or from the plurality of memory cells;
    a second memory contact configured to communicate address signals or command signals to the plurality of memory cells;
    a shared external contact configured to communicate the data signals in a first mode, and to receive the address signals or the command signals in a second mode;
    a bi-directional interface configured to communicate the data signals between the shared external contact and the first memory contact in the first mode, and to communicate the address signals or the command signals from the shared external contact to the second memory contact in the second mode;
    a control input configured to change a mode of the memory device between the first mode and the second mode; and
    a semiconductor package including the plurality of memory cells, at least part of the shared electrical conductor, and the interface.

2. The memory device of claim 1, further comprising an application specific integrated circuit included in the semiconductor package and configured to communicate the data signals, address signals or command signals to the interface via the shared external contact.

3. The memory device of claim 1, further comprising another shared electrical contact partially included in the semiconductor package and configured to communicate data signals in the first mode and to receive address signals in the second mode.

4. The memory device of claim 1, wherein the memory device includes a dynamic random access memory.

5. A system comprising:
a semiconductor package;
a plurality of memory cells incorporated in the semiconductor package and configured to store data, the memory cells coupled to a first memory contact and a second memory contact;
a shared contact at least partially external to the semiconductor package and configured to receive a first signal in a first mode and a second signal in a second mode;
a first bi-directional circuit incorporated in the semiconductor package and configured to communicate the first signal between the shared contact and the first conductor in the first mode;
a second bi-directional circuit incorporated in the semiconductor package and configured to communicate the second signal between the shared contact and the second conductor in the second mode; and
a control input to the semiconductor package and configured for changing between the first mode and the second mode.

6. The system of claim 5, wherein the first signal is an address signal and the second signal is a data signal.

7. The system of claim 5, wherein the first memory contact and the second memory contact are configured to communicate signals according to a JEDEC JESD79E standard or a JEDEC JESD79-2C standard.

8. The system of claim 5, wherein the first signal is a control signal and the second signal is a data signal, according to a JEDEC JESD79E standard or a JEDEC JESD79-2C standard.

9. The system of claim 5, wherein the first signal is a control signal and the second signal is an address signal, according to a JEDEC JESD79E standard or a JEDEC JESD79-2C standard.

10. The system of claim 5, wherein the shared contact is one of at least 16 shared contacts partially included within the semiconductor package and configured to communicate data signals in the first mode, and either address signals or command signals in the second mode.

11. The system of claim 5, wherein the memory device includes a static random access memory.

12. The system of claim 5, wherein the memory device includes a programmable dynamic random access memory.

13. A memory device comprising:
a plurality of memory cells configured to store data and coupled to a first memory contact and a second memory contact;
a shared contact configured to receive a first signal during a first time period and a second signal during a second time period;
a bi-directional circuit configured to communicate the first signal between the shared contact and the first memory contact during the first time period and communicate the second signal between the device contact and the second memory contact during the second time period; and
a semiconductor device package including the plurality of memory cells, at least part of the shared contact, and the circuit.

14. The memory device of claim 13, wherein the first memory contact and the second memory contact are configured to receive signals according to a JEDEC JESD79E standard or a JEDEC JESD79-2C standard.

15. The memory of claim 13, wherein the first memory contact is disposed on the same semi-conductor wafer as the plurality of memory cells.

16. A system comprising:
a semiconductor package containing a memory configured to store data;
a first memory contact electronically coupled to the memory;
a second memory contact electronically coupled to the memory;
a first shared contact external to the memory, the first shared contact configured to communicate with a device external to the semiconductor package, and configured to receive a first signal in a first mode and a second signal in a second mode; and
at least one bi-directional circuit configured to convey the first signal from the first terminal to the first memory contact when the memory is in the first mode, and to convey the second signal from the first terminal to the second memory contact when the memory is in the second mode.

17. The memory of claim 16, wherein the second memory contact is contained entirely within the semiconductor package.

18. The memory of claim 16, wherein the first memory contact is disposed on the same semi-conductor wafer as the plurality of memory cells.

19. The system of claim 16, further comprising a second shared contact configured to change a mode of the memory between the first mode and the second mode.

20. The system of claim 16, further comprising a circuit configured to automatically change the multiplexer circuit between the first mode and the second mode in response to receiving an address or a memory command.

* * * * *